United States Patent [19]

Ibarra

[11] Patent Number: 5,738,323
[45] Date of Patent: Apr. 14, 1998

[54] POSITIONER FOR OVERHANGING COMPONENTS

[75] Inventor: Tony Ibarra, Boise, Id.

[73] Assignee: Micron Electronics, Inc., Nampa, Id.

[21] Appl. No.: 707,159

[22] Filed: Sep. 3, 1996

[51] Int. Cl.[6] .................................................. A47G 5/00
[52] U.S. Cl. ........................................................ 248/288.11
[58] Field of Search ........................... 248/288.11, 290.1, 248/282.1, 278.1, 125.7, 200.1

[56] References Cited

U.S. PATENT DOCUMENTS

| | | | |
|---|---|---|---|
| 787,119 | 4/1905 | Scott | 248/282.1 |
| 1,318,703 | 10/1919 | Stuchlak | 248/282.1 X |
| 3,155,359 | 11/1964 | Hogan et al. | 248/288.11 |
| 3,329,385 | 7/1967 | Dietsch | 248/290.1 |
| 4,651,966 | 3/1987 | Susuki | 248/282.1 X |
| 5,271,593 | 12/1993 | Kinner et al. | 248/278.1 X |

FOREIGN PATENT DOCUMENTS

808091 1/1959 United Kingdom ............... 248/288.11

*Primary Examiner*—Ramon O. Ramirez
*Attorney, Agent, or Firm*—Craig M. Korfanta

[57] ABSTRACT

A pivotal mounting bracket for positioning overhanging components includes a positive registration mechanism which ensures that the component is exactly positioned upon return to its working position after being pivoted to allow access to an underlying component. The registration system uses a spring to bias the base of the pivoting bracket into a conformantly shaped receiving recess in the main bracket base. The shape of the base of the pivotal bracket and the receiving recess in the main bracket base is selected to provide only a single position within a given range of possible positions in which the geometry's of the base of the pivotal bracket exactly line up with the geometry's of the main base bracket receiving recess.

15 Claims, 6 Drawing Sheets

POSITIONER FOR OVERHANGING COMPONENTS

BACKGROUND OF THE INVENTION

1. Field of the Invention

This invention relates generally to a component mounting bracket and, more specifically, to an overhanging component positioner for precisely positioning a first component, such as a sensing device, over another component, where the first component can be temporarily pivoted out of the way of access to the second component and then easily and precisely repositioned back over the first component.

2. Background of the Invention

Automated manufacturing and packaging techniques often require the tracking of articles of manufacture as they progress through the manufacturing and packaging processes. This can be accomplished using optical transducers such as a photodiode emitter and receiver pair using the articles of manufacture as a reflector or diffuser to make or break the optical circuit. The range of these optics can be extended using fiber optic waveguides to position the sensing point at remote locations and in crowded environments. Lenses are also employed to focus and/or collimate the light for more accurate detection. One of the most difficult problems one faces when employing these kinds of position sensors is the accurate positioning and calibration of the sensors. Retooling and maintenance of the manufacturing line has meant that the sensors had to be removed to allow access to the underlying tooling and then repositioned and calibrated, if necessary, once the changes or maintenance was completed. Additionally, retooling to accommodate different package sizes has traditionally meant moving a substantial portion of each sensor from one location to another.

A particularly acute example of this problem occurs in an automated semiconductor chip marking device. One of the most effective chip marking devices uses a laser beam to mark the surface of the chip package. Unlike ink stamping, laser marking is fast, requires no curing time, and produces a consistently high-quality mark with minimal set-up time. In these devices, the laser beam burns a mark into the surface of the article of manufacture to produce a permanent mark, in contrast to inked marks, which may smear, degrade, fade or wear off. In the case of a packaged chip, the laser marking creates a different reflectivity from the rest of the package surface. Thus, by holding the chip at an angle to a light source, the information inscribed on the chip by the laser can easily be read.

Various machines and methods have been developed for marking a chip or other article of manufacture with a laser. As illustrated in U.S. Pat. No. 5,357,077 to Tsuruta, a plurality of semiconductor devices are placed in a tubular holder and transported by a coextensive group of conveyor belts to a laser for marking. Similarly, in U.S. Pat. No. 4,638,144 to Latta, Jr., electronic parts in the form of strips of lead frame supported components are conveyed to a laser marking station in magazines, unloaded, laser marked, and then reloaded into magazines. Likewise in U.S. Pat. No. 4,375,025 to Carlson, a strip of electronic components is conveyed by drive wheels to and from a position where a laser beam inscribes various characters or other information on the component surfaces. U.S. Pat. No. 4,370,542 to Mills et al. discloses a laser marking apparatus for marking a cable. The apparatus sequentially moves laterally adjacent cables along a marking platen and selectively positions and operates a laterally translatable laser to mark a stationary cable portion while another cable portion is being moved.

These devices require accurate indexing and positioning of the individual manufactured parts and the laser itself. The laser marking apparatus described and shown in the "Detailed Description of the Preferred Embodiment" section which follows, is capable of marking two separate rows of several individual parts at a time. Accordingly, the marking apparatus must count, position and track many parts. Additionally, the marking device uses gravity channels or tracks to guide the chips into position for marking and reloading into the chip carrying tubes. These tracks must be changed out for different sized chip packages which means that any other components which obstruct the removal and replacement of the tracks, such as the optical sensors, must be removed and reinstalled, often in a different location to accommodate the different package size, each time a different sized package is processed. The sensors often obstruct the removal and replacement of the tracks because it is desirable to position sensors, especially optical sensors, as close to the objects to be sensed as possible. Also, because the sensors must rely on a nearly perpendicular reflective surface, they are usually installed directly above the path in which the packages flow since mounting the sensors in the tracks is impractical and interferes with track integrity. Unfortunately, this often results in the sensors interfering with other subsystems such as machine vision systems and the write path of the laser. The same sort of problems exist in other automated manufacturing machines in which these sensors are employed.

It would therefore be desirable to have a sensor mounting apparatus which allows a sensor to be pivoted out of the way to allow for removal, replacement and/or maintenance of the underlying tooling and then subsequently pivoted back into position having the sensor in close proximity to the underlying tooling and accurately positioned to prevent the need for recalibration. Additionally, it would be desirable to have a sensor mounting apparatus which positions the sensor in a position other than either directly above the part path or directly to the side of the part path.

SUMMARY OF THE INVENTION

Accordingly, the present invention provides a pivotal mounting bracket for positioning overhanging components which includes a positive registration mechanism which ensures that the component is exactly positioned upon return to its working position. In the currently preferred embodiment, the registration system uses a spring to bias the base of the pivoting bracket into a conformantly shaped receiving recess in the main bracket base. The shape of the base of the pivotal bracket and the receiving recess in the main bracket base is selected to provide only a single position within a given range of possible positions in which the geometry's of the base of the pivotal bracket exactly line up with the geometry's of the main base bracket receiving recess.

Additionally, the present invention provides a mounting bracket for positioning a component, such as an optical sensor, both above and to one side of the path of the objects to be sensed, thereby allowing access to the top surface of the object for processing.

The currently preferred embodiment employs a square shaped base on the pivotal bracket member and a conformant square shaped receiving recess in the main stationary bracket base, thereby providing four possible registered positions for the pivotal member. A component arm extends from the top of the pivotal bracket member to provide a point of attachment for a component, such as an optical sensor. A second embodiment uses a tongue and groove registration mechanism which enables the pivotal bracket member to be translated along the main stationary bracket base on an axis parallel to the part path to provide adjustment to compensate for different sized objects without affecting the positioning of the sensor along an axis perpendicular to the part path.

In the currently preferred embodiment, the pivotal bracket member is pivotally attached to the base member using a shoulder bolt through its base and threadedly engaged in the center of the receiving recess in the stationary base member. A coil spring circumscribes the shank of the shoulder bolt in at least a slightly compressed state and is purchased between the underside of the head of the shoulder bolt and the base of the pivotal member. Thus, pulling the pivotal member away from the stationary base member results in the spring compressing further. If the registration mechanism, e.g. the geometry's of the pivotal base and the receiving recess, are lined up when the pivotal member is freed, the pivotal member will be forced into one of the registered positions and will remain there until it is forced otherwise by a force sufficient to overcome that exerted by the spring.

In the semiconductor chip manufacturing example cited above and used in the preferred embodiment, chips to be marked are gravity fed from magazines into slotted tracks inclined at a particular angle relative to the support surface. The chips freely slide along the track when not retained by microprocessor-controlled indexing pins responsive to various optical sensor signals positioned along the apparatus. The indexing pins extend through the tracks to hold chips at a certain location (e.g., staging locations and marking locations) and then be retracted to allow one or more chips to continue through the marking apparatus. The sensors are positioned over the tracks and aligned such that a chip package within the slot in the track will break the beam of light emitted from the emitter and reflected back to the receiver. The sensor and indexing pin system is used to stage chips form marking, count chips for production quotas and packaging and to route chip samples and defective chips for quality control purposes.

For example. while the laser beam is actively marking a chip at one marking location, other chips are being staged. Once a chip has been marked, the laser source alternates to the adjacent marking location and begins marking another chip while the previously marked chip is being replaced by an unmarked chip. In this manner, the laser is substantially continually marking a chip at one or the other of the marking locations and is not waiting for chips to be positioned at a marking location. Additionally, more than one chip may be present at each marking location. That is, a plurality of chips are positioned (preferably in a row) at each marking location and all of the chips at one marking location are marked in succession, and then replaced by a like plurality of unmarked chips while the laser marks a plurality of chips at another marking location. Hence it is both necessary to count and stage multiple chips in this exemplary marking process.

Additional advantages and novel features of the invention will be set forth in part in the description that follows, and in part will become apparent to those skilled in the art upon examination of the following or may be learned by practice of the invention.

DETAILED DESCRIPTION OF THE PREFERRED EMBODIMENT

The present invention will be described in detail in connection with a laser marking apparatus which represents one possible application of the invention. This particular application was chosen simply because it is illustrative of both the function and a particular problem which the invention solves. It should be understood that the invention is equally applicable to other applications, apparatus and processes.

Figure 1:
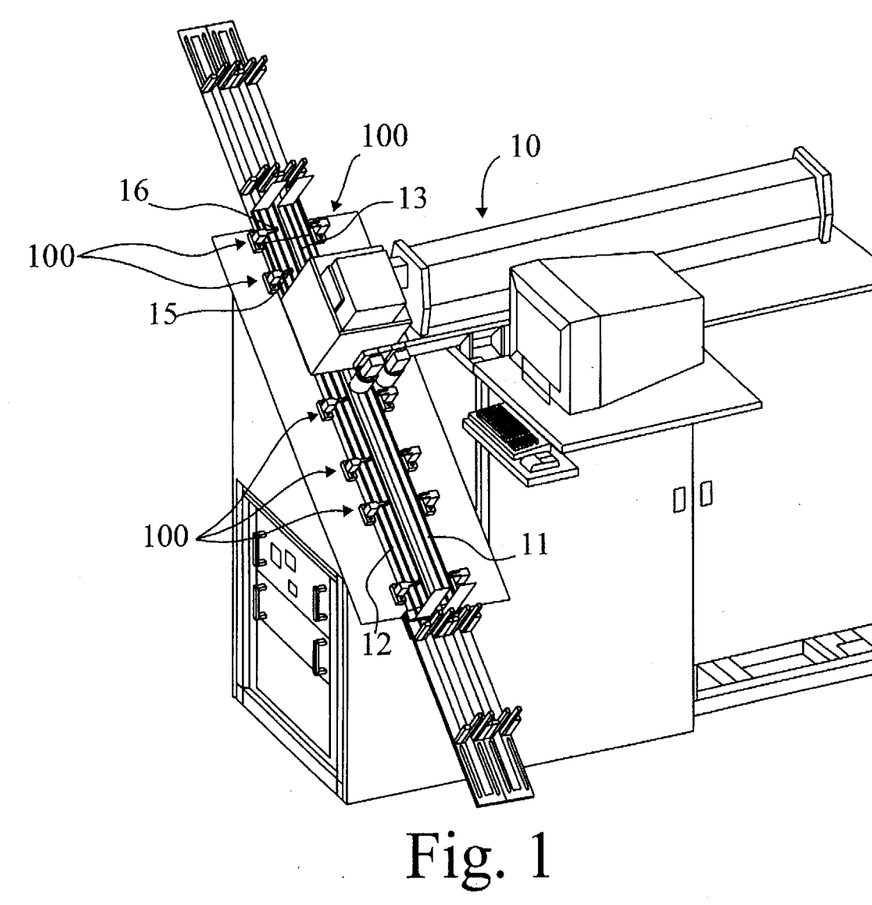
FIG. 1 is a perspective view of a laser marking apparatus employing sensor positioners according to the invention.

Referring to the figures, a laser marking apparatus 10 is illustrated which employs pivotal mounting brackets 100 for positioning overhanging components. Pivotal mounting brackets 100 may also be referred to as overhanging component positioners 100 or simply component positioners 100, all in accordance with the invention. Laser marking apparatus 10 is shown having a left track 11 and a right track 12 which are substantially similar and thus reference to elements associated with one track will apply to the other unless otherwise stated. Generally, the chips are automatically fed through laser marking apparatus 10 for marking purposes. Tracks 11 and 12 are inclined at about a 40° angle to the horizontal for gravity feed. The chips are supplied by a magazine or feed tube, which is preferably stacked under a number of like magazines which are indexed vertically (relative to the orientation of the track) by a feed indexing foot as the lowermost magazine is emptied. When released from magazine by a mechanical release mechanism, the chips slide into the low friction channel within track 11. The tracks preferably envelope the chips such that in cross-section track 11 includes troughs to accommodate passage of the leads of the chips.

Optical sensors such as those shown at 15 and 16 are positioned at various points on the apparatus to detect the presence of articles of manufacture, here semiconductor chips. It should be noted that overhanging component positioner 100 is capable of supporting other sensors such as magnetic sensors, electric field sensors, audio sensors, and the like or even components other than sensors. For instance, overhanging component positioner 100 could be used to support overhanging indexing pins, spray nozzles, electromagnetic radiation sources, etc., all depending upon the particular application.

Figure 2:
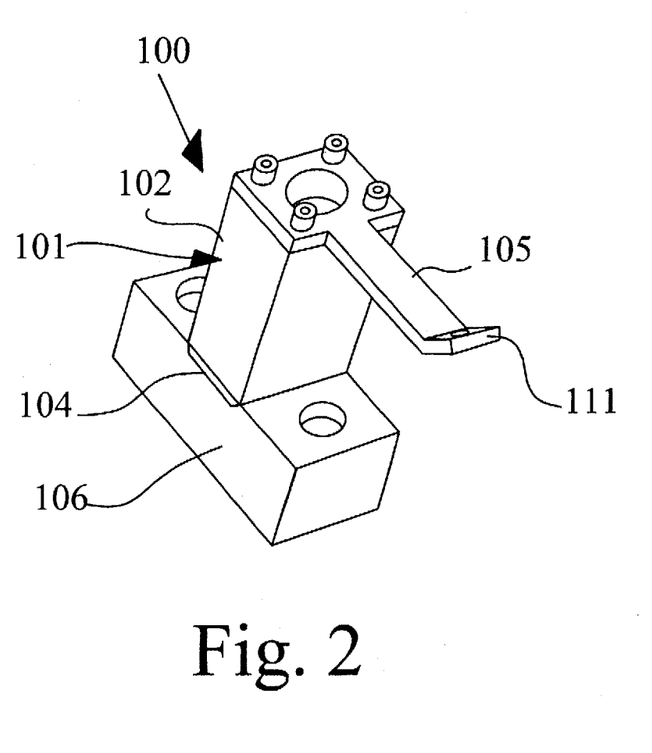
FIG. 2 is a perspective view of a sensor positioner according to the invention.
Figure 3:
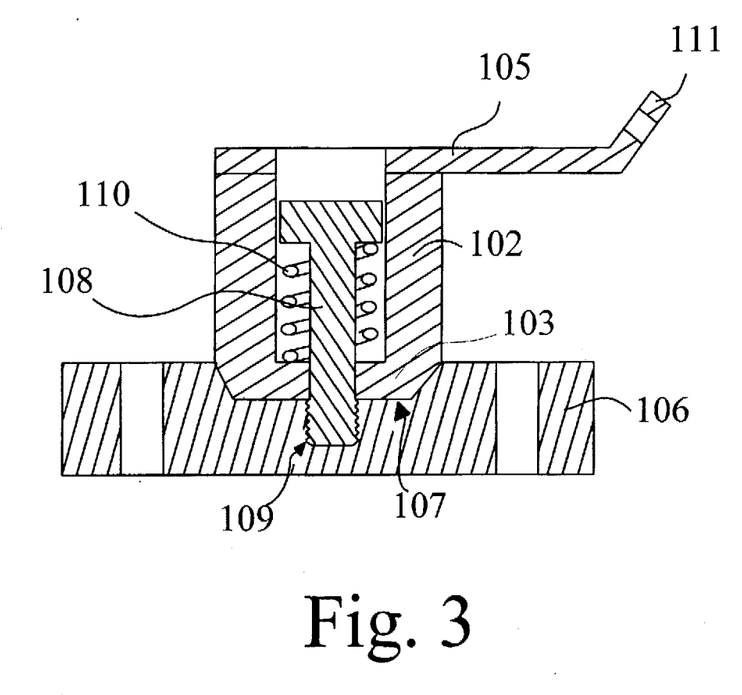
FIG. 3 is a cross-sectional view of a sensor positioner according to the invention.

FIGS. 2 and 3 show overhanging component positioner 100 in detail. Component positioner 100 has a pivoting bracket member 101 pivotally attached to stationary base member 106 using a spring loaded shoulder bolt connection between pivoting bracket member 101 and stationary base member 106. A generally horizontally projecting component arm 105 is attached to pivoting bracket member body 102, here at the top of pivoting bracket member body 102. Arm 105 has an upwardly extending distal end 111 which provides a convenient attachment point for components such as sensors and the like.

Pivoting bracket member body 102 is here a rectangular block having a cylindrical bore therein to slidably receive shoulder bolt 108. It should be noted that other geometry's for body 102 are possible as well as are other pivoting connections rather than shoulder bolt 108. Here, a base plate, also referred to as pivoting bracket member base 103, forms the bottom end of body 102. Base 103 is square in shape and has chamfered edges to facilitate registration of pivoting bracket member 101 into the receiving recess 107 in stationary base member 106. Base 103 is provided with a centrally located aperture of sufficient size to slidably and rotatably receive the shank of shoulder bolt 108. The aperture is of a diameter less than that of coil spring 110 for reasons which, if not apparent now, will become apparent in the following description.

A stationary base member 106 is provided to serve both as an anchoring platform for attaching component positioner 100 to a substrate such as marking apparatus 10 and as a reference structure against which pivoting bracket member 101 can reference or register. Stationary base member 106 has a receiving recess 107 formed therein which conforms in both size and shape to the size and shape of pivotal bracket member base 103, including the chamfered edges, to closely receive and hold pivotal bracket member base 103. Receiving recess 107 has a centrally located threaded hole 109 to receive and engage the threaded end of shoulder bolt 108.

Pivotal bracket member 101 and stationary base member 106 are pivotally and partially separably attached together using a spring loaded shoulder bolt connection. This is accomplished by inserting the shank of shoulder bolt 108 through the center of coil spring 110 and then through the aperture in pivotal bracket member base 103 and engaging the threads of shoulder bolt 108 with those of hole 109. The lengths of shoulder bolt 108 and coil spring 110 are selected such that coil spring 110 is under tension when pivotal bracket member base 103 is fully engaged with receiving recess 107.

Figure 4:
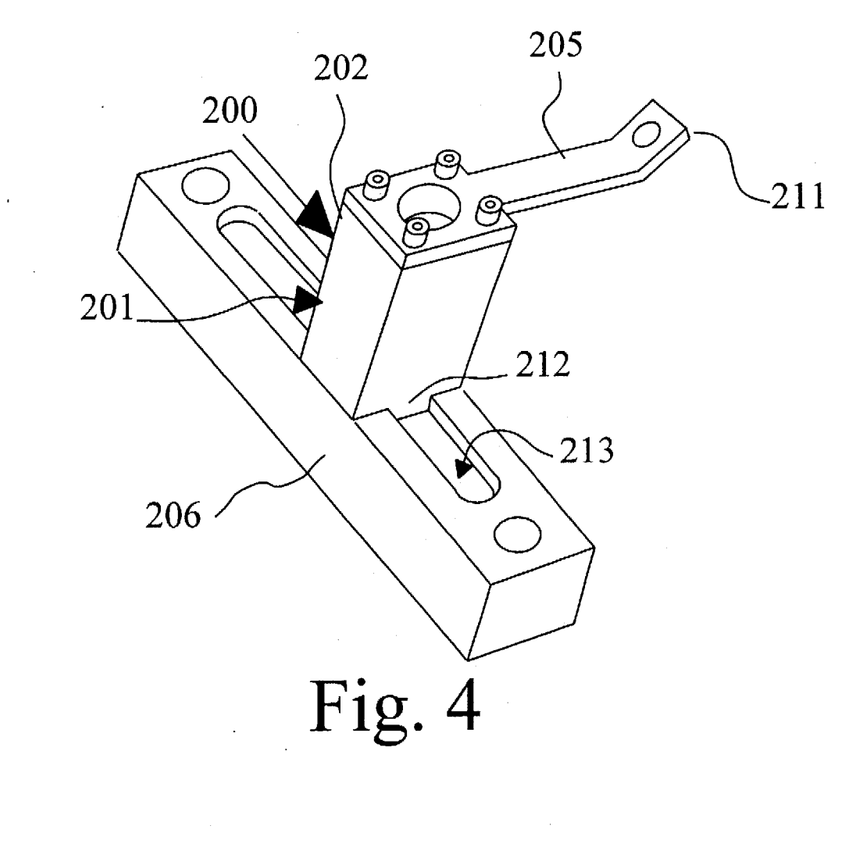
FIG. 4 is a perspective view of the second embodiment of a sensor positioner according to the invention.
Figure 5:
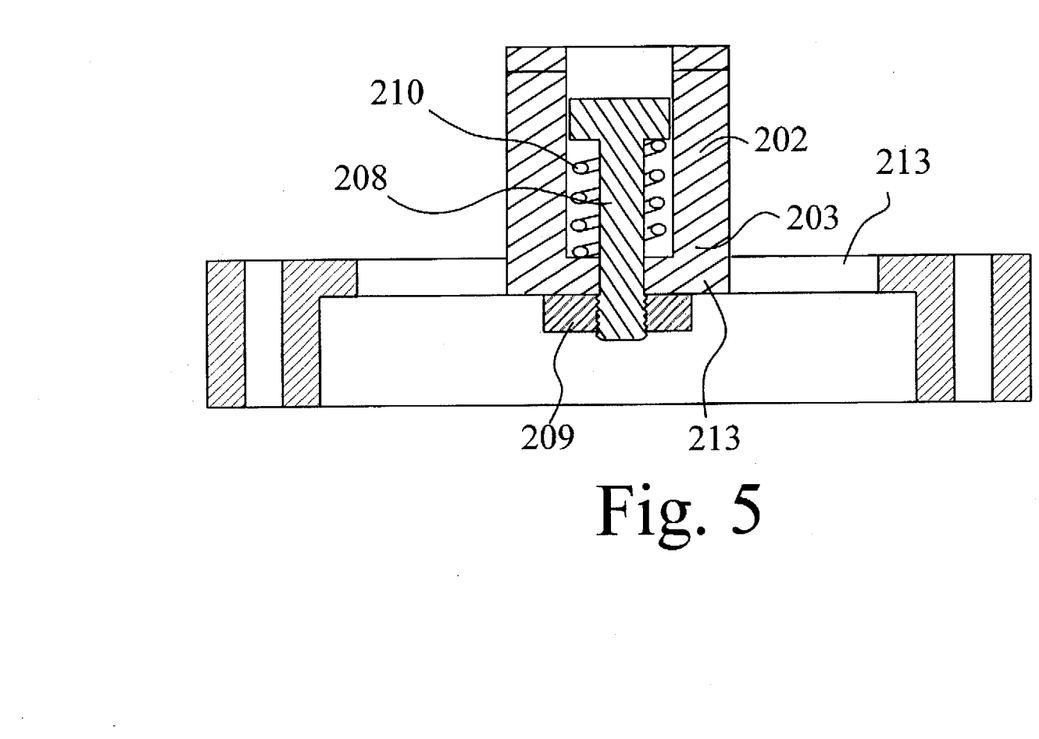
FIG. 5 is a cross sectional view of a sensor positioner according to the invention taken along a centerline parallel to the part path flow.
Figure 6:
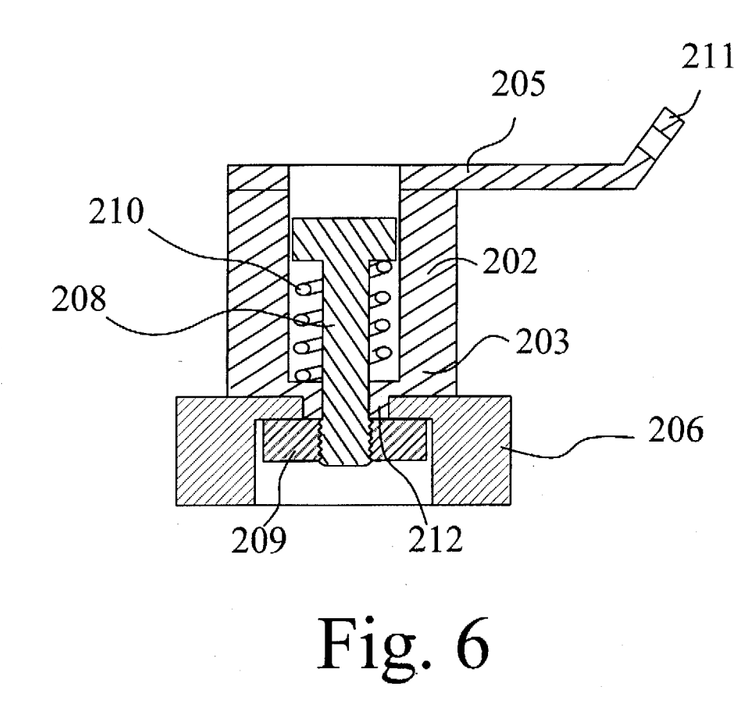
FIG. 6 is a cross sectional view of a sensor positioner according to the invention taken along a centerline perpendicular to the part path flow.

FIGS. 4 through 6 show a second embodiment designated as component positioner 200. Component positioner 200 incorporates a translation assembly into the registration mechanism. Here, the registration mechanism uses a tongue and groove configuration to allow pivoting bracket member 201 to both pivot and slide with respect to bracket member base 206. The base 203 of pivoting bracket member 201 has a protruding tongue 212 formed thereon sized and shaped to be slidably received within groove 213 in stationary base member 206. A shoulder bolt nut 209 is engaged with the threaded end of shoulder bolt 208 to hold pivoting bracket member 201 against stationary base 206 in a spring loaded fashion. This particular registration mechanism provides for two registered positions for pivotal member 201 which are 180° apart.

In both of these embodiments, the distal ends 111 and 211 of component arms 105 and 205 include an upwardly extending portion to facilitate the proper positioning of a component to be held, here optical transducers. In this particular instance, the upwardly extending portions extend upward at an angle of approximately 45° with respect to the plane containing the top surface of pivotal bracket member 101 or 201. It should be understood that the angles are variable and that the configuration of component arms 105 and 205 can be altered to include other than rectilinear forms. However, this particular configuration positions the sensors above and to one side of the direct vertical line of sight to the part path, thereby allowing unobstructed access to the top surface of the parts being processed.

In this example, when the chips are released from the feed magazine aligned with the track 11, several chips are staged by automated indexing pins at the initial staging area 13. The indexing pins are generally dual-action air (pneumatic) cylinders with two-way positive air valve operation for upward extension through the track surface and retraction. The optical sensors employed in this example are light beam-interrupt type sensors which each employ an emitter and receiver pair. The beam emitters for the sensors (such as LED's, either directly or through optical fibers), are aimed from above and to one side of center of the track at an angle toward a reflective surface within the track channel so that the emitted light reflects back to the photoreceiver in the sensor, thereby positioning the out of the direct vertical line of sight and access. Breaking of the light beam indicates presence of a chip at that track location. In this hypothetical example, optical sensor 15 senses the presence of the foremost chip in a group when the chips are being staged upstream of an indexing pin just downstream of sensor 15, and optical sensor 16 senses when the proper number of chips have been staged as a group and are present in the staging area 13, causing an indexing pin just upstream of sensor 16 to activate and impede further movement of the chips into staging area 13.

In the event a section of track, or the entire track, needs to be serviced or replaced, the user simply grasps the pivotal member 101 201 of each component positioner 100 or 200, lifts it away from its stationary base member 106 or 206 and pivots the bracket member, typically 90°, until component arm 105 or 205 no longer interferes with access to the underlying component, here track 11 or 12. Once servicing of the underlying components is completed, the pivotal bracket members are pivoted back to their original positions.

In these embodiments, component positioners 100 and 200 are manufactured from aluminum or stock of like characteristic, using suitable connectors between the various parts, because the electrical and non-corrosive characteristics of aluminum are suitable for semiconductor chip manufacture, however other materials may be employed in both this manufacturing process and other processes in which the invention is used according to the particular environment. Other geometry's may also be used in the registration mechanism such as triangular shapes, regular and irregular polygons, irregular closed curves or a combination of these to provide a shape facilitating a range of one to only a limited number of registered positions for component positioners 100 and 200. Also, the recess could be positioned on the pivotal member and the conforming protrusion could be positioned on the stationary base member.

The shape of the interface between the pivoting and stationary members dictates the number of registered positions available. For example, the square shape provides four separate positions while a triangle would provide three. Irregular shapes would likely provide one or two positions, depending upon the actual shape. The tongue and groove registration mechanism of positioner 200 provides two registered positions Additionally, while the shoulder bolt is positioned centrally within the base and the receiving recess, this is not necessary as it could be positioned off center. Nor is it even necessary to employ a shoulder bolt and or a coil spring. For example, a pin of other sorts could be used. Or, the pin could be eliminated altogether using instead a tensive coil spring anchored at one of its ends to a point below the upper surface of the receiving recess and at its other end to the base of the pivotal bracket member.

While there is shown and described the preferred embodiment of the invention, it is to be distinctly understood that this invention is not limited thereto but may be variously embodied to practice within the scope of the following claims.

I claim:

1. A bracket for holding a first component in an overhanging orientation over a second component which comprises:
   a base member being fixable in a stationary position relative to the second component;
   a pivotal bracket member being pivotally attached to the base member;
   an arm being attached to the pivotal bracket member and extending generally radially outward therefrom, the arm having an attachment point for the first component; and
   a pivotal registration mechanism operatively attached between the base member and the pivotal bracket member, the registration mechanism being configured to selectively stop and hold the pivotal bracket member in an angular position with respect to the base member.

2. A bracket for holding a first component in an overhanging orientation over a second component which comprises:
   a base member being fixable in a stationary position relative to the second component;
   a pivotal bracket member being pivotally attached to the base member;
   an arm being attached to the pivotal bracket member and extending generally radially outward therefrom, the arm having an attachment point for the first component;
   a pivotal registration mechanism operatively attached between the base member and the pivotal bracket member wherein the pivotal bracket member has a pivotal bracket member base of a specific size and shape and the pivotal bracket member is pivotally attached to the base member at the pivotal bracket member base, the registration mechanism being configured to selectively stop and hold the pivotal bracket member in an angular position with respect to the base member; and
   the base member has a recess of a size and shape conforming to the shape of the pivotal bracket member base to closely receive the same.

3. A bracket for holding a first component in an overhanging orientation over a second component which comprises:
   a base member being fixable in a stationary position relative to the second component;
   a pivotal bracket member being pivotally attached to the base member;
   an arm being attached to the pivotal bracket member and extending generally radially outward therefrom, the arm having an attachment point for the first component;
   a registration mechanism operatively attached between the base member and the pivotal bracket member wherein the pivotal bracket member has a pivotal bracket member base of a specific size and shape and the pivotal bracket member is pivotally attached to the base member at the pivotal bracket member base;
   the base member having a recess of a size and shape conforming to the shape of the pivotal bracket member base to closely receive the same;
   a shoulder bolt being theadedly engaged with the base member through an aperture in the pivotal bracket member base, the shoulder bolt including a shank and a head; and
   a coil spring being wrapped around the shank and compressed between the pivotal bracket member base and the head of the shoulder bolt.

4. A bracket for holding a first component in an overhanging orientation over a second component which comprises:
   a base member being fixable in a stationary position relative to the second component;
   a pivotal bracket member being pivotally attached to the base member;
   an arm being attached to the pivotal bracket member and extending generally radially outward therefrom, the arm having an attachment point for the first component;
   a registration mechanism operatively attached between the base member and the pivotal bracket member wherein the pivotal bracket member has a pivotal bracket member base having a square shape and chamfered edges and the pivotal bracket member is pivotally attached to the base member at the pivotal bracket member base;
   the base member having a recess having a square shape and chamfered edges conforming to the shape of the pivotal bracket member base to closely receive the same;
   a shoulder bolt being theadedly engaged with the base member through an aperture in the pivotal bracket member base, the shoulder bolt including a shank and a head; and
   a coil spring being wrapped around the shank and compressed between the pivotal bracket member base and the head of the shoulder bolt.

5. A bracket for holding a first component in an overhanging orientation over a second component which comprises:
   a base member being fixable in a stationary position relative to the second component;
   a pivotal bracket member being pivotally attached to the base member;
   an arm being attached to the pivotal bracket member and extending generally radially outward therefrom, the arm having an attachment point for the first component;
   a pivotal registration mechanism operatively attached between the base member and the pivotal bracket member wherein the pivotal bracket member has a pivotal bracket member base having a square shape and chamfered edges and the pivotal bracket member is pivotally attached to the base member at the pivotal bracket member base, the registration mechanism being configured to selectively stop and hold the pivotal bracket member in an angular position with respect to the base member; and
   the base member has a recess having a square shape and chamfered edges conforming to the shape of the pivotal bracket member base to closely receive the same.

6. A bracket for holding a first component in an overhanging orientation over a second component which comprises:
   a base member being fixable in a stationary position relative to the second component;
   a pivotal bracket member being pivotally attached to the base member;
   an arm being attached to the pivotal bracket member and extending generally radially outward therefrom, the arm having an attachment point for the first component;
   a registration mechanism operatively attached between the base member and the pivotal bracket member wherein the pivotal bracket member has a pivotal bracket member base having a tongue protruding therefrom and the pivotal bracket member is pivotally attached to the base member at the pivotal bracket member base;

the base member having a recess formed in the shape of an elongated slot to slidably receive the tongue of the pivotal bracket member base;

a shoulder bolt being theadedly engaged with the base member through an aperture in the pivotal bracket member base, the shoulder bolt including a shank and a head; and a coil spring being wrapped around the shank and compressed between the pivotal bracket member base and the head of the shoulder bolt.

7. A bracket for holding a first component in an overhanging orientation over a second component which comprises:

a base member being fixable in a stationary position relative to the second component;

a pivotal bracket member being pivotally attached to the base member;

an arm being attached to the pivotal bracket member and extending generally radially outward therefrom, the arm having an attachment point for the first component; and a registration mechanism operatively attached between the base member and the pivotal bracket member wherein the pivotal bracket member has a pivotal bracket member base having a tongue protruding therefrom and the pivotal bracket member is pivotally attached to the base member at the pivotal bracket member base; and the base member has a recess formed in the shape of an elongated slot to slidably receive the tongue of the pivotal bracket member base.

8. In combination with a machine for marking semiconductor chips with identifying indicia, a bracket for holding an optical sensor in an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor; and a pivotal registration mechanism operatively attached between the base member and the pivotal bracket member, the registration mechanism being configured to selectively stop and hold the pivotal bracket member in an angular position with respect to the base member.

9. In combination with a machine for marking semiconductor chips with identifying indicia, a bracket for holding an optical sensor In an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor;

a pivotal registration mechanism operatively attached between the base member and the pivotal bracket member wherein the pivotal bracket member has a pivotal bracket member base of a specific size and shape and the pivotal bracket member is pivotally attached to the base member at the pivotal bracket member base, the registration mechanism being configured to selectively stop and hold the pivotal bracket member in an angular position with respect to the base member; and the base member having a recess of a size and shape conforming to the shape of the pivotal bracket member base to closely receive the same.

10. In combination with a machine for marking semiconductor chips with identifying indicia, a bracket for holding an optical sensor in an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor;

a registration mechanism operatively attached between the base member and the pivotal bracket member wherein the pivotal bracket member has a pivotal bracket member base of a specific size and shape and the pivotal bracket member is pivotally attached to the base member at the pivotal bracket member base;

the base member having a recess of a size and shape conforming to the shape of the pivotal bracket member base to closely receive the same;

a shoulder bolt being theadedly engaged with the base member through an aperture in the pivotal bracket member base, the shoulder bolt including a shank and a head; and a coil spring being wrapped around the shank and compressed between the pivotal bracket base and the head of the shoulder bolt.

11. In combination with a machine for marking semiconductor chips with identifying indicia, a bracket for holding an optical sensor in an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor;

a registration mechanism operatively attached between the base member and the pivotal bracket member wherein the pivotal bracket member has a pivotal bracket member base having a square shape and chamfered edges and the pivotal bracket member is pivotally attached to the base member at the pivotal bracket member base;

the base member having a square shape and chamfered edges conforming to the shape of the pivotal bracket member base to closely receive the same;

a shoulder bolt being theadedly engaged with the base member through an aperture in the pivotal bracket member base, the shoulder bolt including a shank and a head; and a coil spring being wrapped around the shank and compressed between the pivotal bracket base and the head of the shoulder bolt.

12. In combination with a machine for marking semiconductor chips with identifying indicia, a bracket for holding an optical sensor in an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor;

a pivotal registration mechanism operatively attached between the base member and the pivotal bracket member wherein the pivotal bracket member has a pivotal bracket member base having a square shape and chamfered edges and the pivotal bracket member is pivotally attached to the base member at the pivotal bracket member base, the registration mechanism being configured to selectively stop and hold the pivotal bracket member in an angular position with respect to the base member; and the base member having a square shape and chamfered edges conforming to the shape of the pivotal bracket member base to closely receive the same.

13. In combination with a machine for marking semiconductor chips with identifying indicia, a bracket for holding an optical sensor in an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor;

a registration mechanism operatively attached between the base member and the pivotal bracket member wherein the pivotal bracket member has a pivotal bracket member base having a tongue protruding therefrom and the pivotal bracket member is pivotally attached to the base member at the pivotal bracket member base; and the base member having a recess formed in the shape of an elongated slot to slidably receive the tongue of the pivotal bracket member base;

a shoulder bolt being theadedly engaged with the base member through an aperture in the pivotal bracket member base, the shoulder bolt including a shank and a head; and a coil spring being wrapped around the shank and compressed between the pivotal bracket base and the head of the shoulder bolt.

14. In combination with a machine for marking semiconductor chips with identifying indicia, a bracket for holding an optical sensor in an overhanging orientation over a track, the bracket comprising:

a base member being fixable in a stationary position relative and proximate to the track;

a pivotal bracket member being pivotally attached to the base member;

an arm being attached to the pivotal bracket member and extending generally radially outward therefrom, the arm having an attachment point for the optical sensor;

a registration mechanism operatively attached between the base member and the pivotal bracket member wherein the pivotal bracket member has a pivotal bracket member base having a tongue protruding therefrom and the pivotal bracket member being pivotally attached to the base member at the pivotal bracket member base; and the base member having a recess formed in the shape of an elongated slot to slidably receive the tongue of the pivotal bracket member base.

15. In combination with a machine for marking semiconductor chips with identifying indicia, a bracket for holding an optical sensor at a predetermined angle, in an overhanging orientation above and to the side of the center of a track, the bracket comprising:

a base member being fixable in a stationary position relative and proximate to the track;

a pivotal bracket member being pivotally attached to the base member and having a sensor mounting portion extending upward therefrom at an angle perpendicular to the predetermined sensor angle, the sensor mounting portion including a hole therethrough positioned and sized to hold a sensor at the predetermined angle and above and to the side of the center of the track;

an arm being attached to the pivotal bracket member and extending generally radially outward therefrom, the arm having an attachment point for the optical sensor; and a pivotal registration mechanism operatively attached between the base member and the pivotal bracket member, the registration mechanism being configured to selectively stop and hold the pivotal bracket member in an angular position with respect to the base member.

* * * * *